United States Patent
Schneider et al.

(10) Patent No.: US 6,784,056 B2
(45) Date of Patent: Aug. 31, 2004

(54) FLASH MEMORY CELL PROCESS USING A HARDMASK

(75) Inventors: Paul A. Schneider, Dallas, TX (US); Freidoon Mehrad, Plano, TX (US); John H. MacPeak, Garland, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/689,947

(22) Filed: Oct. 21, 2003

(65) Prior Publication Data

US 2004/0085830 A1 May 6, 2004

Related U.S. Application Data

(62) Division of application No. 10/047,522, filed on Oct. 26, 2001, now Pat. No. 6,667,210.

(51) Int. Cl.⁷ ............................................. H01L 21/336

(52) U.S. Cl. ........................................ 438/257; 438/211
(58) Field of Search ................................. 438/211, 264, 438/265, 267, 250, 393, 396

(56) References Cited

U.S. PATENT DOCUMENTS

| | | |
|---|---|---|
| 5,994,197 A | 11/1999 | Liao |
| 6,037,223 A | 3/2000 | Su et al. |
| 6,214,715 B1 * | 4/2001 | Huang et al. ............... 438/597 |
| 6,391,716 B1 | 5/2002 | Liou |

* cited by examiner

Primary Examiner—Phuc T. Dang
(74) Attorney, Agent, or Firm—Peter K. McLarty; W. James Brady, III; Frederick J. Telecky, Jr.

(57) ABSTRACT

A method is described for forming a memory structure using a hardmask (65). The hardmask (65) protects the second polysilicon layer (55) during a SAS etch process. In addition, sidewall structures (95) are formed which protect the inter-polysilicon dielectric layer (45) during the hardmask (65) etch process.

5 Claims, 2 Drawing Sheets

FLASH MEMORY CELL PROCESS USING A HARDMASK

This application is a divisional of application Ser. No. 10/047,522, filed Oct. 26, 2001 now U.S. Pat. No. 6,667,210.

FIELD OF THE INVENTION

The present invention relates to a method of forming a flash memory cell using a hardmask and self-aligned source etch process.

BACKGROUND OF THE INVENTION

As new technologies shrink the requirements put on the photolithographic process is becoming more stringent. This is especially the case in flash memory cell fabrication. Flash memory typically comprises a double polysilicon layer structure with a dielectric layer between the polysilicon layers. In fabricating this double polysilicon flash memory cell, photoresist is often used a mask during multiple etching process. This requirement places a limitation on the minimum thickness of photoresist that can be used. It is advantageous however to use a thin photoresist layer to improve the resolution of the lithography.

One of the etch process which the photoresist layer must withstand is the self-aligned source (SAS) etch process. In this process, regions of the silicon oxide isolation structures are removed to form a continuous conductive source line connecting numerous flash memory cells. The SAS etch usually comprises a plasma based silicon oxide etch. Because of limitations in forming a photoresist mask for the SAS etch process, a portion of the memory cell is usually exposed to the SAS etch. This often leads to removal of a portion of the upper polysilicon layer during the SAS etch process. There is therefore a need for a flash cell process in which thin photoresist is used while adequately protecting the memory cell during the SAS etch process.

SUMMARY OF INVENTION

The instant invention describes a method for forming a memory cell structure using a hardmask. The hardmask allows the utilization of thinner photoresist layers which improves the resolution of existing photoresist patterning techniques. In addition, the hardmask protects the polysilicon layer during the self-aligned source etch process. In particular the method comprises: providing a semiconductor substrate with isolation structures, a first dielectric layer, and a first polysilicon layer on said first dielectric layer; forming an inter-polysilicon dielectric layer on said first polysilicon layer; forming a second polysilicon layer on said inter-polysilicon layer; forming a hardmask layer on said second polysilicon layer; forming a patterned photoresist film on said hardmask layer; and etching said hardmask layer, said second polysilicon layer, and said inter-polysilicon dielectric layer with a multi-step etch process wherein said multi-step etch process removes said patterned photoresist layer.

BRIEF DESCRIPTION OF THE DRAWINGS

For a more complete understanding of the present invention and the advantages thereof, reference is now made to the following description taken in conjunction with the accompanying drawings, wherein like reference numerals represent like features, in which.

DETAILED DESCRIPTION OF THE INVENTION

Figure 1:
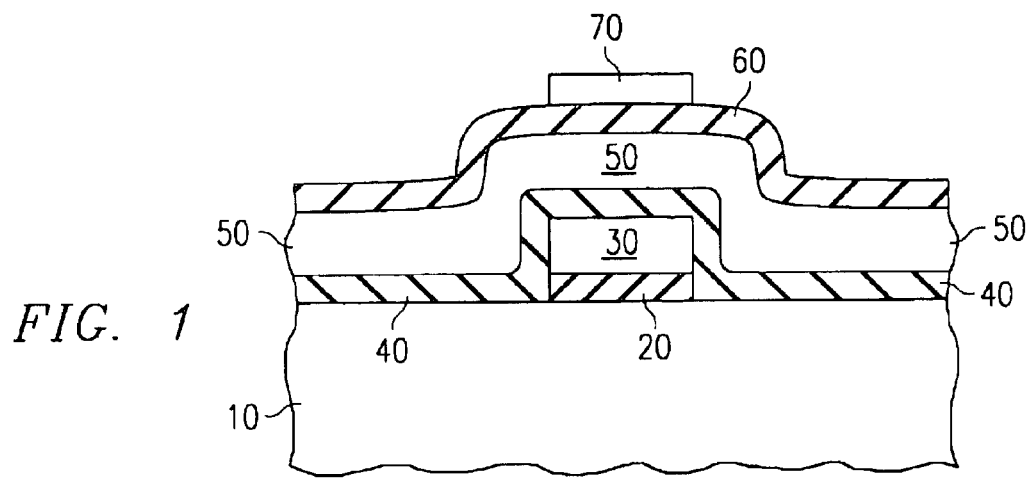
FIGS. 1–3 are cross-section diagrams showing the formation of a flash memory structure using the method of the instant invention.
Figure 2:
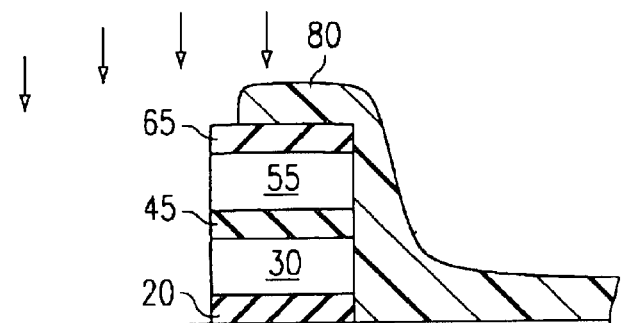
Figure 3A:
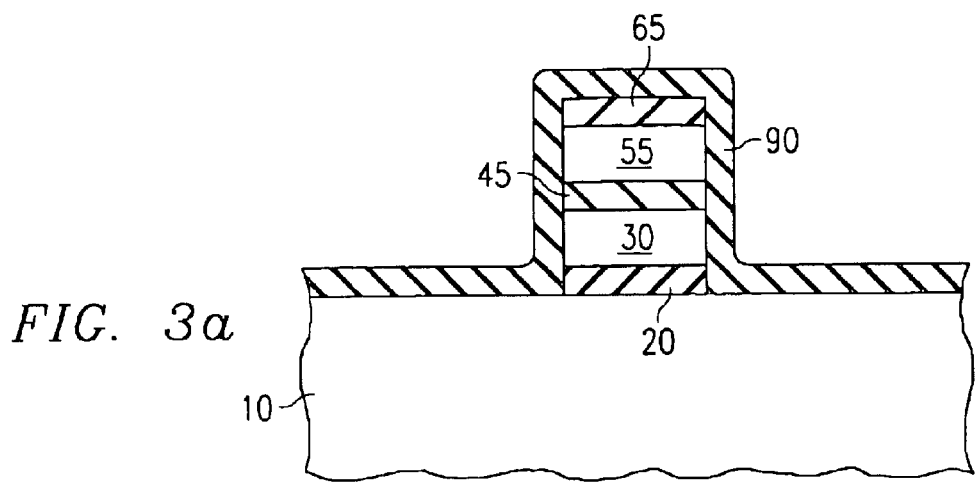
Figure 3B:
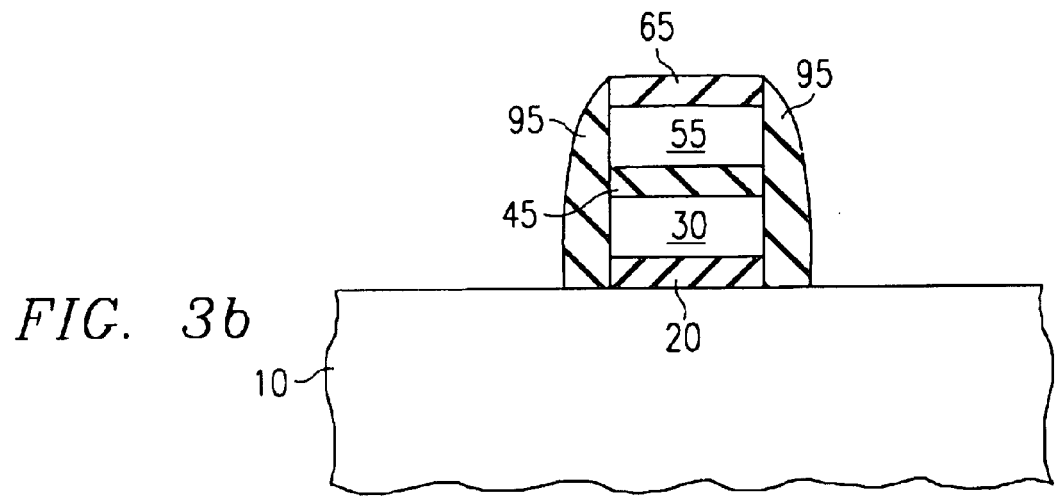
Figure 3C:
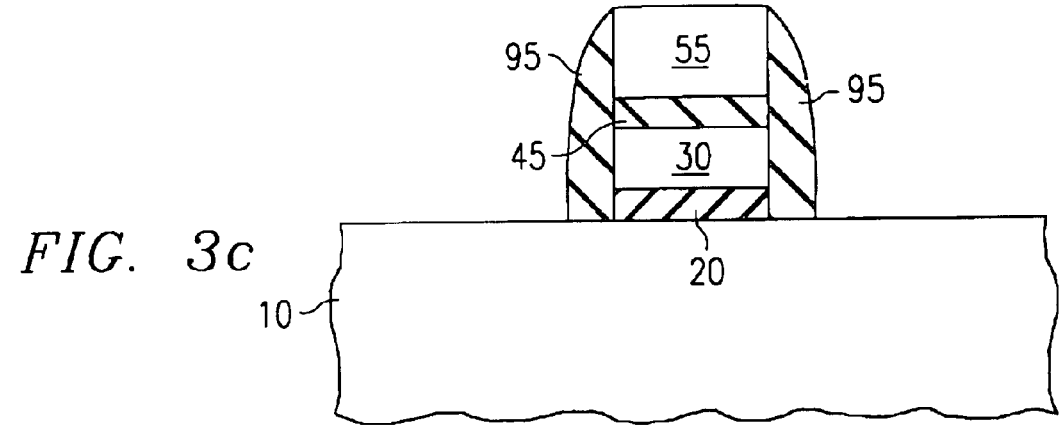

Illustrated in FIGS. 1–3 are cross-section diagrams showing the formation of a flash memory structure using the method of the instant invention. This method allows for the use of a thin photoresist mask while protecting the memory structure during the SAS etch process. It is not intended however that the method of the instant invention be limited to this device. Many additional applications of the instant invention will be apparent to those of ordinary skill in the art.

Referring to FIG. 1, a semiconductor substrate 10 is provided. A first dielectric layer 20 is formed on the substrate using known methods. This first dielectric layer will be between 10 A and 150 A thick and is formed with a material selected from the group of silicon oxide, silicon oxynitride, silicon nitride, a silicate, or any combination of these materials. Following the formation of the gate dielectric layer 20, a first polysilicon layer 30 is formed on the dielectric layer 20. This polysilicon layer is formed by first depositing a blanket polysilicon film on which a patterned photoresist layer is formed. The blanket polysilicon film is then etched resulting in the formation of the first polysilicon layer 30. Following the formation of the first polysilicon layer, an inter-polysilicon dielectric layer is formed 40. This inter-polysilicon dielectric layer can formed using silicon oxide, silicon nitride, silicon oxynitride, or any number of alternating layers of silicon oxide and silicon nitride. Following the formation of the inter-polysilicon dielectric layer 40, a second polysilicon layer 50 is formed. A hardmask layer 60 is formed on the second polysilicon layer 50. In an embodiment of the instant invention, the hardmask layer will comprise a 700 A to 1500 A silicon nitride layer. The silicon nitride layer can be formed in a deposition process chamber using the following process conditions:

| Silicon Nitride | Process Conditions |
| --- | --- |
| DCS (Dichlorosilane) | 6–16 sccm |
| NH3 | 600–950 sccm |
| Temperature | 740° C. |
| Time | 30–60 min |

Following the formation of the hardmask, 60 a photoresist film is formed and patterned as shown in FIG. 1. The thickness of the photoresist used to form 60 is in the range of 300 A to 500 A which is thinner than the 800 A photoresist film thickness normally required. Following the formation of the patterned photoresist film 70, the structure is etched using a number of different dry etch processes.

The various layers of FIG. 1 are etched using the following multi-step dry etch process:

| Parameter | units | Step 1 | Step 2 | Step 3 | Step 4 | Step 5 | Step 6 | Step 7 |
|---|---|---|---|---|---|---|---|---|
| Time | secs | EP | 3–7 | 7–13 | EP | 20–35 | 30–60 | 85–110 |
| Pressure | mtorr | 2–6 | 2–6 | 2–6 | 2–6 | 80–120 | 5–7 | 90–120 |
| Bias | W | 50 | 50 | 40 | 50 | 150 | 140 | 150 |
| Source | W | 500 | 500 | 500 | 550 | 1000 | 1100 | 1000 |
| HBr | sccm | — | — | — | 100 | 160 | 160 | 160 |
| O2 | sccm | 4–8 | 3–8 | — | — | — | — | — |
| CF4 | sccm | 70–90 | 70–85 | 40–65 | 20–30 | — | 5–14 | — |
| CL2 | sccm | — | — | — | 55–70 | — | — | — |
| HeO2 | sccm | — | — | — | 10–19 | 7–13 | — | 7–15 |
| CHF3 | sccm | — | — | — | — | — | 6–13 | — |
| Ar | sccm | — | — | — | — | — | 36–46 | — |

In step 1 of the multi-step etch, the unmasked regions of the silicon nitride layer 60 is removed. In step 2, a silicon nitride layer over-etch is performed. Step 3 of the etch process is a break-through etch that removes any silicon nitride or silicon oxide from the second polysilicon layer 50. The unmasked region of the second polysilicon layer 50 is removed using steps 4 and 5 of the etch process. This exposes the underlying unmasked regions of the inter-polysilicon layer 40 which is removed by step 6 of the etch process. Step 7 is used to remove portions of the first polysilicon layer 30 not shown in the Figures. The patterned photoresist layer 70 is also removed during the multi-step etch process. The patterned hardmask layer 65, the patterned second polysilicon layer 55, and the patterned inter-polysilicon dielectric layer 45 are shown in FIG. 2.

Following the etching of layers 60, 50, and 40, a patterned photoresist layer 80 is formed and used as a mask during the SAS etch process. The portion of the patterned hardmask layer 65 that is exposed to the SAS etch protects the second patterned polysilicon layer 55 from the etch process. In an embodiment of the instant invention, the SAS etch is a silicon oxide etch using the following conditions:

| parameter | units | SAS etch |
|---|---|---|
| time | seconds | 55–75 |
| pressure | mtorr | 40–49 |
| Rf Lower | W | 2000 |
| Rf Upper | W | 1000 |
| ESC Volts | V | 700 |
| CHF3 | sccm | 5–9 |
| Ar | sccm | 280–330 |
| CF4 | sccm | 6–9 |
| CO | sccm | 180–210 |

This etch has etch rates of 4000 A/min for silicon oxide and 44 A/min for silicon nitride. The silicon nitride layer of the multi-layer hardmask will therefore adequately protect the polysilicon layer 55.

Following the SAS etch process, the photoresist layer is removed and a cap layer 90 is formed on the memory cell structure as shown in FIG. 3(a). In an embodiment of the instant invention this cap layer 90 comprises a silicon oxide layer formed using the following process:

| Silicon Oxide | Process Conditions |
|---|---|
| TEOS | 120–150 sccm |
| O2 | 2–8 sccm |
| Temperature | 600–750° C. |
| Time | 6–11 min |

This thickness of this silicon oxide layer 90 is in the range of 120 A–290 A. Following the cap layer 90 formation, an anisotropic etch is performed to form the sidewall structures 95 shown in FIG. 3(b). These sidewall structures will provide protection for the inter-polysilicon patterned layer 45 during the hardmask removal process. In an embodiment where the hardmask comprises silicon nitride and the cap layer comprises silicon oxide, the hardmask layer 65 can removed using a hot phosphoric acid etch process. This will remove silicon nitride without attacking the silicon oxide sidewall structures 45. Following the removal of the hardmask layer 65, the flash memory cell can be completed using known processing methods.

While this invention has been described with reference to illustrative embodiments, this description is not intended to be construed in a limiting sense. Various modifications and combinations of the illustrative embodiments, as well as other embodiments of the invention will be apparent to persons skilled in the art upon reference to the description. It is therefore intended that the appended claims encompass any such modifications or embodiments.

We claim:

1. A method to form a self-aligned source in a memory cell, comprising:

providing a semiconductor substrate with a memory structure comprising a first dielectric layer, a first polysilicon layer on said dielectric layer, an inter-polysilicon dielectric layer on said first polysilicon layer, a second polysilicon layer on said inter-polysilicon dielectric layer, and a hardmask layer on said second polysilicon layer;

performing a self-aligned source etch process;

forming a cap layer on said memory structure;

performing an anisotropic cap layer etch to form sidewall structures on said memory structure; and removing said hardmask layer using a hardmask etch process.

2. The method of claim 1 wherein said hardmask layer comprises a silicon oxide layer and a silicon nitride layer.

3. The method of claim 2 wherein said self-aligned source etch comprises a dry silicon oxide etch.

4. The method of claim 2 wherein said cap layer comprises silicon oxide.

5. The method of claim 4 wherein said removing said hardmask layer comprises using a hot phosphoric etch process.

* * * * *